United States Patent
Oomen et al.

(10) Patent No.: US 9,759,787 B2
(45) Date of Patent: Sep. 12, 2017

(54) COIL SYSTEM FOR A MAGNETIC RESONANCE TOMOGRAPHY SYSTEM

(71) Applicants: Marijn Pieter Oomen, Erlangen (DE); Robert Rehner, Neunkirchen am Brand (DE); Peter van Haβelt, Erlangen (DE)

(72) Inventors: Marijn Pieter Oomen, Erlangen (DE); Robert Rehner, Neunkirchen am Brand (DE); Peter van Haβelt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 603 days.

(21) Appl. No.: 13/915,486

(22) Filed: Jun. 11, 2013

(65) Prior Publication Data

US 2013/0331269 A1    Dec. 12, 2013

(30) Foreign Application Priority Data

Jun. 12, 2012 (DE) .......................... 10 2012 209 754

(51) Int. Cl.
| | |
|---|---|
| *F25B 19/00* | (2006.01) |
| *G01R 33/34* | (2006.01) |
| *F17C 7/02* | (2006.01) |
| *F17C 7/00* | (2006.01) |

(Continued)

(52) U.S. Cl.
CPC ... *G01R 33/34023* (2013.01); *G01R 33/3403* (2013.01); *F17C 7/00* (2013.01); *F17C 7/02* (2013.01); *F17C 9/00* (2013.01); *G01R 33/3415* (2013.01); *G01R 33/34015* (2013.01)

(58) Field of Classification Search
CPC ..... F17C 7/00; F17C 7/02; F17C 9/00; G01R 33/34015; G01R 33/3403; G01R 33/34023; G01R 33/3415
See application file for complete search history.

(56) References Cited

U.S. PATENT DOCUMENTS

| | | | | |
|---|---|---|---|---|
| 5,903,150 | A | * | 5/1999 | Roznitsky ...................... 324/318 |
| 5,913,888 | A | * | 6/1999 | Steinmeyer ............ F25B 9/145 |
| | | | | 62/259.2 |
| 6,038,867 | A | * | 3/2000 | Einziger et al. ............... 62/45.1 |

(Continued)

FOREIGN PATENT DOCUMENTS

| | | |
|---|---|---|
| CN | 101322041 A | 12/2008 |
| CN | 102309324 A | 1/2012 |

(Continued)

OTHER PUBLICATIONS

Black et al., A High-Temperature Superconducting Receiver for Nuclear Magnetic Reasonance Microscopy, Feb. 5, 1993, Science, vol. 259, No. 5096.*

(Continued)

*Primary Examiner* — David Teitelbaum
(74) *Attorney, Agent, or Firm* — Lempia Summerfield Katz LLC

(57) ABSTRACT

A coil system for a magnetic resonance tomography system includes a plurality of coils for sending and/or receiving high-frequency signals. The plurality of coils is disposed in a receiving chamber between a tomography magnet and a lining of an opening in the tomography magnet and may be cooled by a cooling apparatus. When the coil system is in an operating state, the receiving chamber is filled with a cryogenic cooling medium.

19 Claims, 3 Drawing Sheets

(51) Int. Cl.
*F17C 9/00* (2006.01)
*G01R 33/3415* (2006.01)

(56) References Cited

U.S. PATENT DOCUMENTS

| | | | |
|---|---|---|---|
| 6,131,396 | A | 10/2000 | Duerr et al. |
| 6,442,948 | B1* | 9/2002 | Takeda .................... 62/48.2 |
| 6,828,889 | B1* | 12/2004 | Zaput ................ G01R 33/3815 324/318 |
| 7,495,442 | B2* | 2/2009 | Heid ............................ 324/318 |
| 7,772,842 | B2 | 8/2010 | Gao et al. |
| 8,013,605 | B2 | 9/2011 | Matschl |
| 8,026,721 | B2 | 9/2011 | Sodickson et al. |
| 2001/0042385 | A1* | 11/2001 | Kaindl et al. ................ 62/436 |
| 2005/0103025 | A1* | 5/2005 | Stautner et al. .................. 62/6 |
| 2007/0101742 | A1* | 5/2007 | Laskaris ............ G01R 33/3804 62/259.2 |
| 2007/0289324 | A1* | 12/2007 | Suzuki et al. ............... 62/259.2 |
| 2009/0275478 | A1* | 11/2009 | Atkins et al. ................ 505/163 |
| 2009/0291850 | A1* | 11/2009 | Schneider et al. ........... 505/162 |
| 2010/0022395 | A1* | 1/2010 | Bittner ........................ 505/163 |
| 2011/0011102 | A1* | 1/2011 | Gao et al. ...................... 62/51.1 |
| 2011/0179808 | A1* | 7/2011 | Kagan et al. ................ 62/48.2 |
| 2012/0161772 | A1 | 6/2012 | Biber et al. |

FOREIGN PATENT DOCUMENTS

| | | |
|---|---|---|
| DE | 19639924 C1 | 4/1998 |
| DE | 102006011254 A1 | 10/2007 |
| DE | 102010025919 A1 | 1/2012 |
| WO | WO 2010/097375 A3 | 9/2010 |

OTHER PUBLICATIONS

English Translation DE102010025919A1.*
German Office Action dated Feb. 14, 2013 for corresponding German Patent Application No. DE 10 2012 209 754.6 with English translation.
Chinese Office Action for Chinese Patent Application No. 201310232412.3, mailed Dec. 24, 2015, with English Translation.

* cited by examiner

COIL SYSTEM FOR A MAGNETIC RESONANCE TOMOGRAPHY SYSTEM

This application claims the benefit of DE 10 2012 209 754.6, filed on Jun. 12, 2012, which is hereby incorporated by reference.

BACKGROUND

The present embodiments relate to a coil system for a magnetic resonance tomography system (e.g., a nuclear spin tomography system).

Magnetic resonance tomography is a method for diagnosing a large number of diseases using imaging. A magnetic resonance tomography system may include at least a background field magnet, a gradient system and high-frequency coils for sending and receiving the high-frequency magnetic resonance signal.

In whole-body magnetic resonance tomography systems, the high-frequency coils may be local field coils that are partially integrated in a patient couch, are to be positioned partially on and around the body of the patient or are disposed in the manner of a helmet around the head. Positioning and removing such local field coils takes time and effort, and the presence of the local field coils in the relatively narrow opening in the magnetic resonance tomography system reinforces the claustrophobic feelings of many patients, contributing to unease.

Such problems may be avoided if the radio frequency coils are positioned in a stationary and invisible manner in the inner wall of the opening in the magnetic resonance tomography system in the manner of a remote body array (RBA). Such a remote body array for whole-body systems is described in WO 2010/097375 A3.

The distance between coils and the body of the patient is unavoidably greater for a remote body array than with local field coils. The strength of the signal to be measured is therefore weaker at the coil sites. The noise received from the body of the patient also decreases proportionally. The inherent noise of the high-frequency coils however remains the same and dominates the signal-to-noise ratio.

With a remote body array without further measures, the signal-to-noise ratio is much lower than with local field coils. As a result, either imaging quality decreases with an otherwise identical system or more time is required to obtain a full recording.

To improve the signal-to-noise ratio with remote body arrays, it is known to cool the high-frequency coils. The inherent noise of the high-frequency coils is proportional to their resistance and temperature. When the coils are cooled to cryogenic temperatures of less than 100 K, the noise is reduced by this alone. In the case of coils made of a normally conducting metal (e.g., copper), resistance also decreases with temperature, so a good signal-to-noise ratio may be achieved in a simple manner. In the case of superconducting high-frequency coils, which are cooled below the critical temperature $T_C$, resistance and therefore inherent noise are negligibly small. The signal-to-noise ratio is thus only determined by the body of the patient and the environment of the coils.

A superconducting coil system for magnetic resonance tomography is known, for example, from U.S. Pat. No. 7,772,842 B2. High-temperature superconducting high-frequency coil arrays are used in U.S. Pat. No. 7,772,842 B2 to allow the imaging of individual body parts (e.g., chest, knee or hand). The cryogenic components are located in a vacuum chamber and are in contact with a chiller via heat-conducting apparatuses. Sapphire plates or heat pipes, for example, may be used for this purpose.

When used for remote body arrays, however, the large extension of the coil system poses problems for such cooling designs. For example, it is not always possible to provide reliable heat dissipation from the coils to the chiller using such heat-conduction apparatuses.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a coil system that allows reliable cooling of the plurality of coils of the coil system while taking up little space is provided.

Such a coil system for a magnetic resonance tomography system includes a plurality of coils for sending and/or receiving high-frequency signals. The plurality of coils is disposed in a receiving chamber between a tomography magnet and a lining of an opening in the tomography magnet and may be cooled by a cooling apparatus. In other words, such a coil system is a remote body array.

In one embodiment, the receiving chamber may be filled with a cryogenic cooling medium when the coil arrangement is in the operating state. In contrast to cooled coil arrangements known from the prior art, cooling is therefore not achieved by coupling the coils thermally to a chiller with the aid of heat pipes or similar heat-conduction apparatuses but by completely immersing the coils in a cryogenic cooling medium. This allows heat to be dissipated reliably from the coils, so that the desired signal-to-noise ratio may be achieved without any problems. At the same time, there is no need for bulky components such as heat pipes, so the coil system may be structured in a compact manner. This is advantageous given the limited space in the opening in a tomography magnet.

In another embodiment, the coils may be made from a high-temperature superconductor (e.g., yttrium barium copper oxide). By cooling such a superconductor to below the critical temperature, the inherent noise of the coils may be eliminated practically completely, thereby resulting in a good signal-to-noise ratio.

In one embodiment, a preamplifier disposed in the receiving chamber is assigned to at least one of the coils. The preamplifier may therefore also benefit from cooling by the cryogenic cooling medium so that amplifier noise is also reduced. The spatially close arrangement of the preamplifier to the respectively assigned coil provides that the signal path for the unamplified signal is also minimized, so that a further noise source may be reduced.

The coils may be cabled in the conventional manner and connected to further components of the electronic transmitter/receiver unit of the magnetic resonance tomography system. In one embodiment, the coils may be coupled inductively to respectively assigned transmitter and/or receiver apparatuses that are disposed outside the receiving chamber. Cables may not be passed through the wall of the receiving chamber, which requires complex sealing from the cryogenic cooling medium.

Liquid nitrogen, helium or neon, may be used as a cryogenic cooling medium. The corresponding cooling medium may be selected according to the critical temperature of the superconductor used in each instance or the desired degree of reduction of inherent noise.

In a further embodiment, the receiving chamber is enclosed by a vacuum jacket to reduce the heat input into the cooling medium and minimize evaporation losses.

To improve the insulation of the cryogenic cooling medium further, insulators such as, for example, perlite powder and/or hollow glass balls may be disposed in the vacuum jacket. These increase the thermal resistance across the vacuum jacket, thereby reducing the heat input.

Alternatively or additionally, an additional superinsulation (e.g., an aluminum-coated Mylar film) may be provided to insulate the vacuum jacket, lining the vacuum jacket to limit the heat input into the cooling medium effectively.

The superinsulation may be interrupted in a predefined pattern in order not to disrupt the propagation of the high-frequency signals.

In a further embodiment, the receiving chamber may be closed off by a plastic seal and/or a metal flange. This allows subsequent access to the coils if replacement or repair work is to be provided.

The cooling apparatus may include a chiller for recondensing evaporated cooling medium, so that the coil system may be operated without ongoing cooling medium losses.

Alternatively, evaporating cooling medium may be released into the environment, and a storage vessel, from which cooling medium may be continuously topped up, may be provided.

In another embodiment, the receiving chamber extends axially over the entire opening in the tomography magnet to allow whole-body recordings. Alternatively, the receiving chamber may also just extend axially over part of the opening in order to create, for example, specialized devices that are suitable for recording individual body parts.

In one embodiment, the receiving chamber has an annular cross section. This is advantageous, for example, with respect to the configuration of any vacuum jacket provided, as such an annular geometry is pressure resistant.

Alternatively, the receiving chamber may also have a D-shaped cross section, with the flat side of the D extending, for example, parallel to the patient couch and being disposed directly below the patient couch to bring the coils to be used there into close spatial proximity to the body of the patient. This improves the signal-to-noise ratio.

The coil arrangement may also have at least one uncooled coil disposed below the patient couch of the magnetic resonance tomography system, so that the coils to be used there may be disposed close to the patient, for example, when the receiving chamber has an annular geometry.

DETAILED DESCRIPTION

Figure 1:
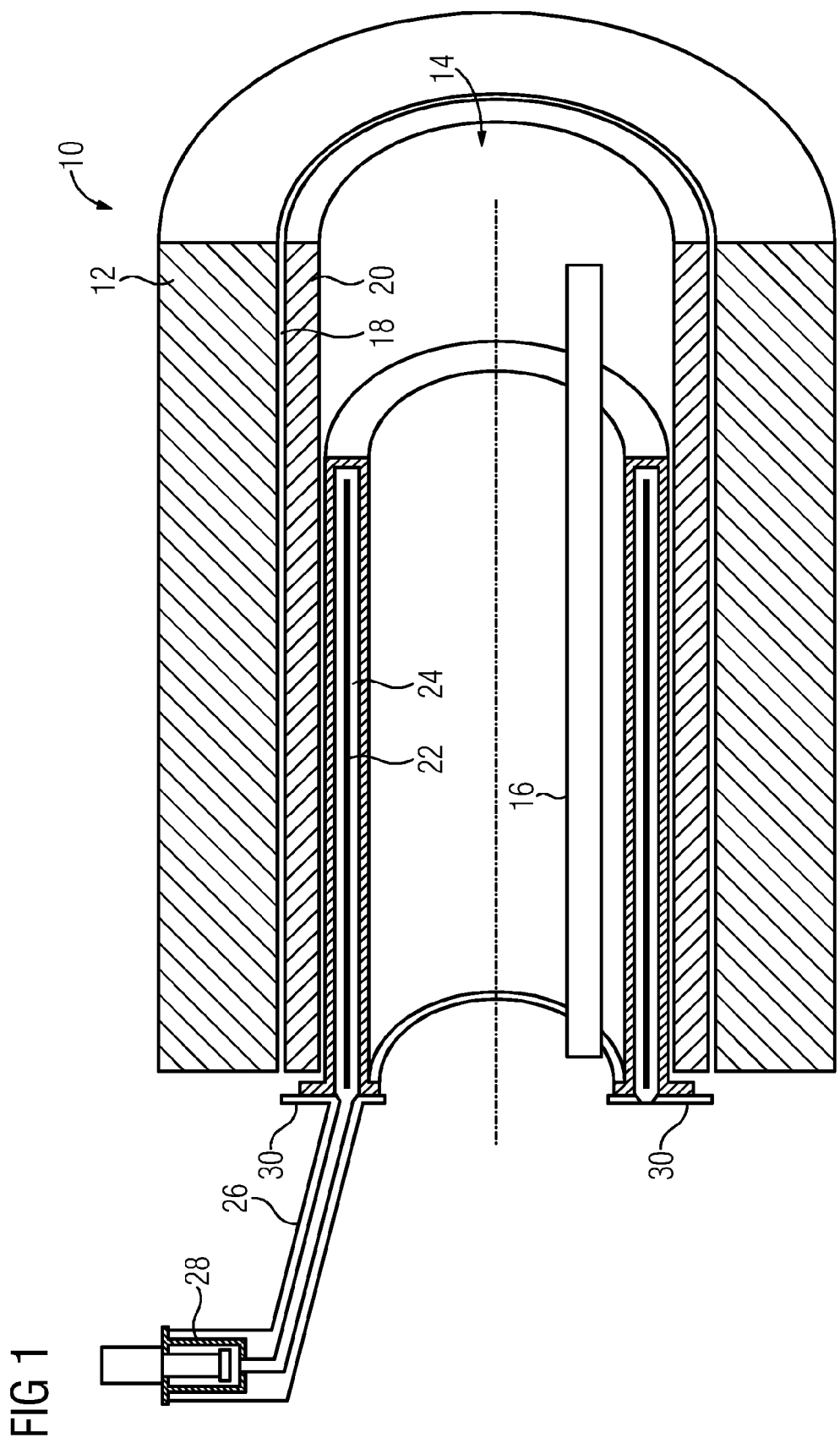
FIG. 1 shows a schematic sectional diagram through a magnetic resonance tomography system with an exemplary embodiment of a coil system.

A magnetic resonance tomography system designated as a whole as 10 includes a background field magnet 12 that is configured as a hollow cylinder, in the opening 14 (e.g., bore) of which a patient couch 16 is disposed. Adjoining an inner lateral surface 18 of the background field magnet 12 is a receiving chamber 20 for gradient coils of the magnetic resonance tomography system 10.

Transmit and receive coils for high-frequency signals, which are used to excite nuclear resonance and to receive the resonance signal, are disposed in a further hollow cylindrical receiving chamber 22 that is enclosed by a vacuum jacket 24.

The receiving chamber 22 for the coils, which are not shown in detail in the figures, is connected via a coolant line 26 to a chiller 28. During operation of the magnetic resonance tomography system 10, the receiving chamber 22 is filled with a cryogenic cooling medium (e.g., liquid nitrogen, liquid helium or liquid neon), with evaporating cooling medium being recondensed by the chiller 28 and fed back to the receiving chamber 22.

The high-frequency coils disposed in the receiving chamber 22 may be made from normally conducting materials (e.g., copper) or alternatively may be made from superconducting materials. Yttrium barium copper oxide coils produced using thin film technology may be used.

The cryogenic cooling of the high-frequency coils significantly improves the signal-to-noise ratio during the recording of magnetic resonance tomograms, so that there may be no need to use coils that are to be positioned directly on the patient, thereby significantly increasing the feeling of space in the NMR opening 14 and preventing claustrophobic anxieties on the part of patients.

In one embodiment, only some of the high-frequency coils present in the receiving chamber 22 are disposed for cooling. For example, only the receive coils may be cooled, while the transmit coils and the high-frequency shield remain hot. In one embodiment, receive and transmit coils may be cooled while the high-frequency shield remains warm. Alternatively, all the receive coils, transmit coils and the high-frequency shield may be cooled.

In order to make contact with the coils in the receiving chamber 22, electric lines may be passed through the walls of the receiving chamber 22. To avoid sealing problems, the coils may be coupled inductively to hot coupling and decoupling coils that are disposed, for example, radially directly inside or outside the receiving chamber 22. Any electric preamplifiers that may be used may be disposed and also cooled in the receiving chamber 22 to keep the signal paths for the unamplified signal as short as possible and to minimize amplifier noise.

To seal the receiving chamber 22 so that no cryogenic coolant may escape into the environment, a closable flange 30 is provided in the illustrated exemplary embodiments, allowing access to the coils if repairs are to be provided. If the flange 30 is made of metal, the flange 30 is to be at a sufficient distance from the imaging volume to prevent any adverse effects on imaging. Full plastic seals, made of PTFE or the like, may be used. Alternatively, the coils in the receiving chamber 22 may be permanently encapsulated by closing off the receiving chamber using corresponding bonded connections.

Figure 2:
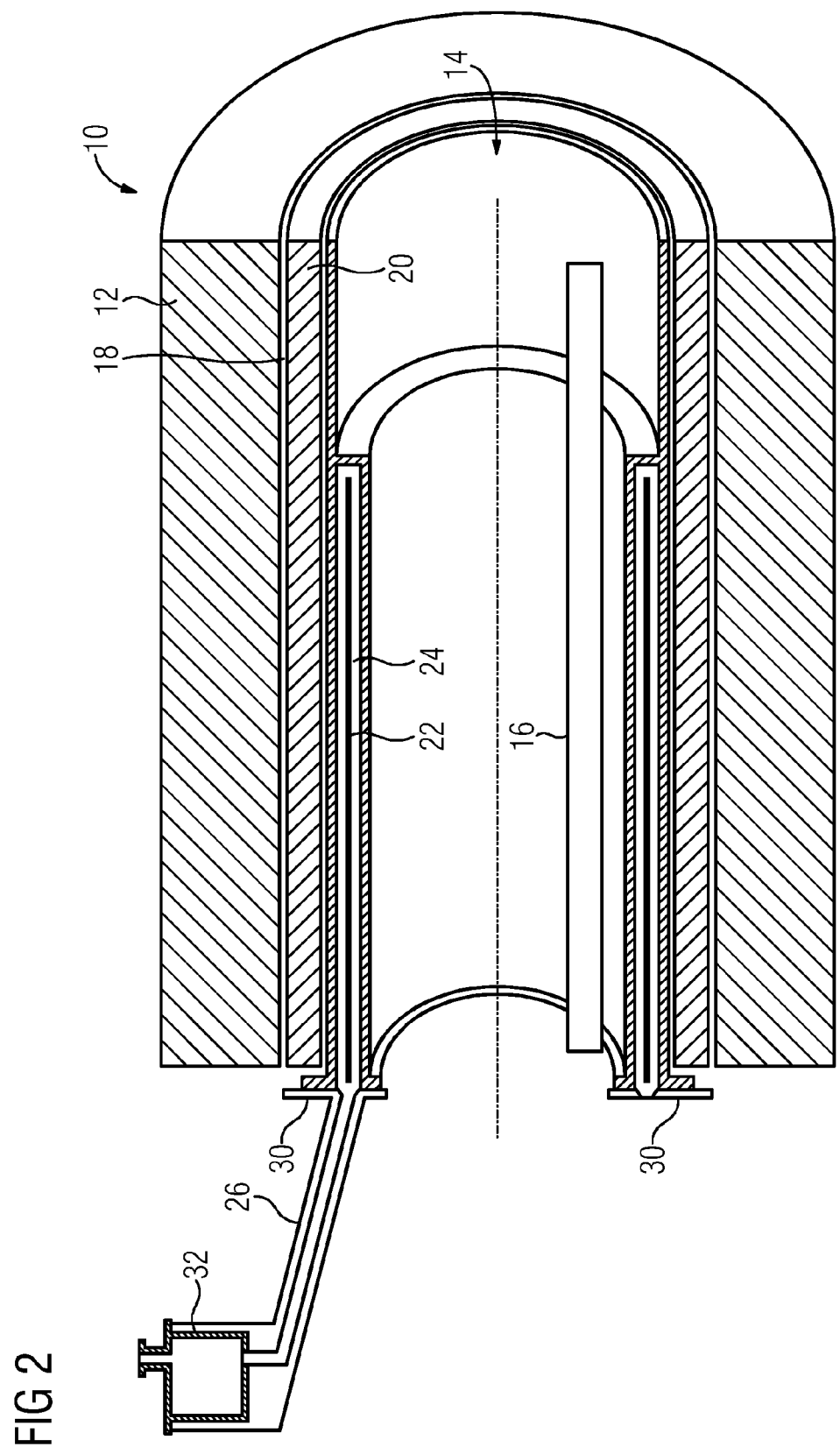
FIG. 2 shows a schematic sectional diagram through a magnetic resonance tomography system with an alternative exemplary embodiment of a coil system without a chiller.

As an alternative to the provision, as illustrated in FIG. 1, of the cryogenic cooling medium by recondensation by the chiller 28, which uses relatively complex pressure and/or temperature regulation, a storage container 32, as shown in FIG. 2, via which coolant may flow into the receiving chamber 22 to replace evaporated coolant volumes, may be provided.

The receiving chamber 22 and the vacuum jacket 24 may either extend over the entire axial length of the opening 14 in the background field magnet 12 or may be extended as far as is necessary for the axial length of the coil array. This would leave more radial space for the patient in the head region, for example, as shown in FIGS. 1 and 2. The transition between the inner radii may be embodied as conical.

In one embodiment, only the vacuum container may be extended over the entire axial length of the opening, as shown in FIG. 2, while the receiving chamber 22 only extends over the body region of the patient. This helps with the damping of the noise produced in the gradient system but gives the patient more radial space than when the receiving chamber 22 extends all the way across the opening 14. Radial transitions may be conical.

To improve imaging in the back region in the conventional magnetic resonance tomography system 10, there are additional coils directly below the patient couch, which are used in addition to the freely movable local coils.

In order to achieve this in a cryogenic coil system, the entire coil arrangement may be held in the cryostat, which then has a D-shaped cross section, in contrast to the exemplary embodiments shown in the figures, being disposed with the flat side directly below the patient couch 16. This includes a greater wall thickness of the vacuum jacket 24, as such geometries are much more pressure sensitive than the circular geometries shown.

Figure 3:
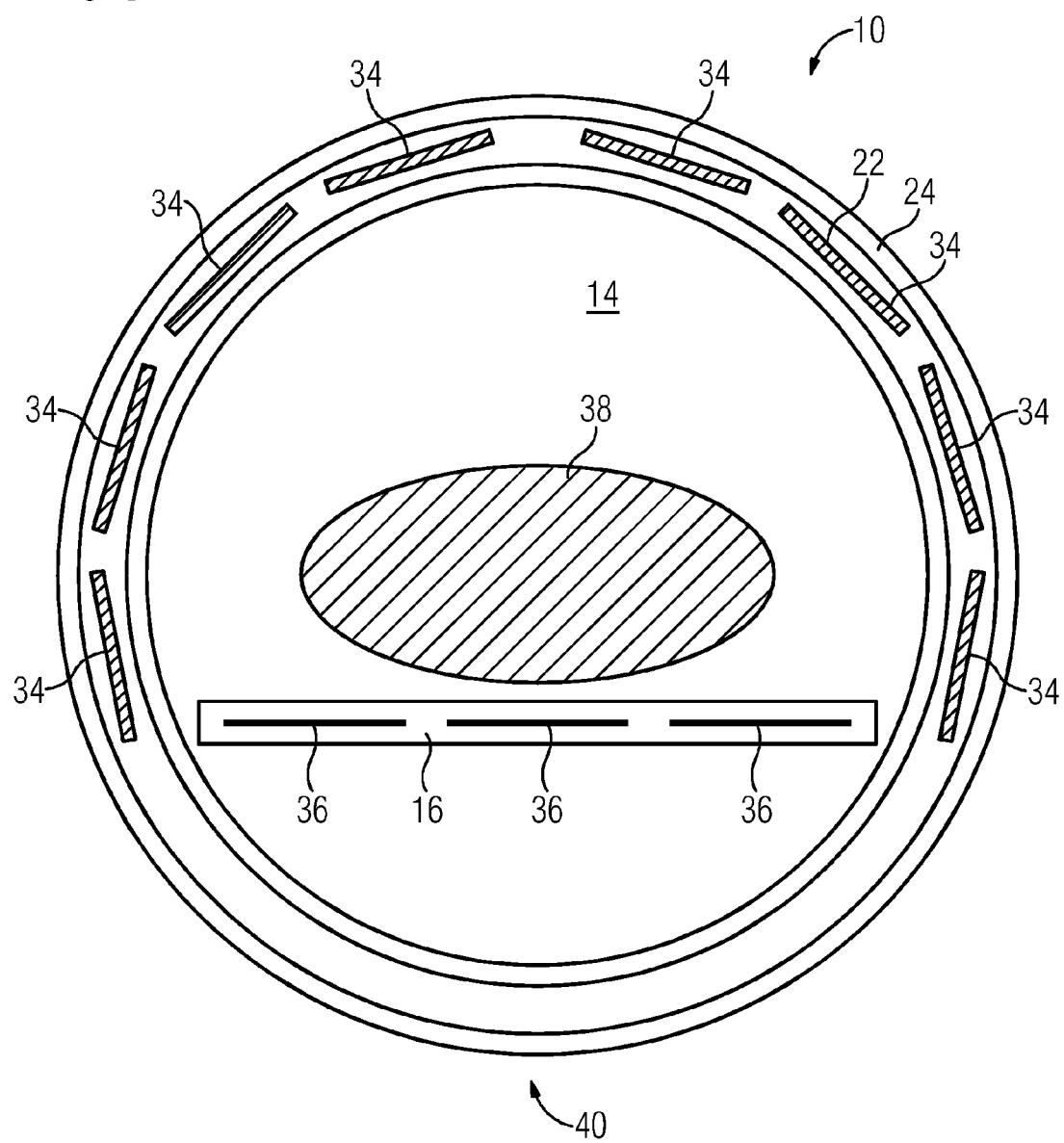
FIG. 3 shows a cross-sectional diagram through a magnetic resonance tomography system according to FIGS. 1 and 2.

As shown in FIG. 3, in addition to the coils 34 held in the receiving chamber 22, a plurality of coils 36 without cryostatic cooling may be integrated directly in the patient couch 16, so that the plurality of coils 36 are disposed close to the patient 38. Cryostatically cooled coils 34 may not be disposed on the lower face 40 of the receiving chamber 22, but this positioning may be provided.

To provide effective thermal insulation of the receiving chamber 22, the vacuum chamber 24 may include additional shielding (e.g., perlite powder, hollow glass balls or one or more layers of superinsulation such as a thin aluminum layer on Mylar film). Since with the thin aluminum layer, imaging may be adversely affected by eddy currents in the aluminum, the superinsulation may also be interrupted, structured so that the superinsulation is divided into small islands or crumpled so that the superinsulation is intentionally interrupted in many places. Different variants or combinations of the above elements may be selected depending on the high-frequency response required.

To reduce the space requirement, different parts of the tomography system 10 may be integrated with one another. For example, before the cryostat is assembled (e.g., before the receiving chamber 22 and vacuum jacket 24 are combined), the entire arrangement of the coils 34 may be positioned directly on the inner wall of the receiving chamber 22. The high-frequency shield may be disposed in the vacuum chamber 24 on the outer wall of the receiving chamber 22. The outer wall of the vacuum chamber 24 may be integrated with the inner tube of the gradient system 20 to save more space.

This may provide a compact and efficient way of cooling the coils 34 of a remote body array of a magnetic resonance tomography system 10 to cryogenic temperatures, thereby achieving very favorable signal-to-noise ratios.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A coil system for a magnetic resonance tomography system, the coil system comprising:
    a background field magnet configured as a hollow cylinder having an opening for a patient couch;
    a cooling apparatus;
    a first receiving chamber positioned adjacent to an inner lateral surface of the background field magnet, the first receiving chamber comprising gradient coils;
    a second receiving chamber positioned adjacent to an inner lateral surface of the first receiving chamber;
    a vacuum jacket enclosing the second receiving chamber;
    a plurality of high-frequency coils that send, receive, or send and receive high-frequency signals, the plurality of high-frequency coils being disposed in the second receiving chamber between a tomography magnet and a lining of an opening in the tomography magnet and being coolable by the cooling apparatus; and
    a preamplifier disposed in the second receiving chamber, the preamplifier being assigned to at least one high-frequency coil of the plurality of high-frequency coils,
    wherein when the coil system is in an operating state, the second receiving chamber is filled with a cryogenic cooling medium.

2. The coil system as claimed in claim 1, wherein the plurality of high-frequency coils is made from a high-temperature superconductor.

3. The coil system as claimed in claim 2, wherein the high-temperature superconductor comprises yttrium barium copper oxide.

4. The coil system as claimed in claim 1, wherein the plurality of high-frequency coils is coupled inductively to respectively assigned transmitter apparatuses, receiver apparatuses, or transmitter and receiver apparatuses that are disposed outside the second receiving chamber.

5. The coil system as claimed in claim 1, wherein the cryogenic cooling medium comprises liquid nitrogen, helium or neon.

6. The coil system as claimed in claim 1, wherein an insulator is disposed in the vacuum jacket.

7. The coil system as claimed in claim 6, wherein the insulator comprises perlite powder, hollow glass balls, or the perlite powder and the hollow glass balls.

8. The coil system as claimed in claim 1, wherein the vacuum jacket is lined with a superinsulation material.

9. The coil system as claimed in claim 8, wherein the superinsulation material comprises an aluminum-coated Mylar film.

10. The coil system as claimed in claim 8, wherein the superinsulation material is interrupted in a predefined pattern.

11. The coil system as claimed in claim 1, wherein the second receiving chamber is operable to be closed off by a plastic seal, a metal flange, or the plastic seal and the metal flange.

12. The coil system as claimed in claim 1, wherein the cooling apparatus comprises a chiller operable to recondense evaporated cooling medium.

13. The coil system as claimed in claim 1, wherein the cooling apparatus comprises a storage vessel for the cooling medium.

14. The coil system as claimed in claim 1, wherein the second receiving chamber extends axially across an entirety of the opening in the tomography magnet.

15. The coil system as claimed in claim 14, wherein the second receiving chamber extends axially over part of the opening in the tomography magnet.

16. The coil system as claimed in claim 1, wherein the second receiving chamber has an annular cross section.

17. The coil system as claimed in claim 1, wherein the second receiving chamber has a D-shaped cross section.

18. The coil system as claimed in claim 1, further comprising: at least one uncooled coil disposed within the patient couch of the magnetic resonance tomography system.

19. The coil system as claimed in claim 1, wherein the plurality of high-frequency coils is completely immersed within the cryogenic cooling medium.

* * * * *